DOUBLE-BRIDGE PUSH-PULL DIFFERENTIAL AMPLIFIER

Filed June 11, 1948 2 Sheets-Sheet 1

*INVENTOR.*
JOHN E. WILLIAMS
*BY* A. H. Helvestine
*ATTORNEY*

DOUBLE-BRIDGE PUSH-PULL DIFFERENTIAL AMPLIFIER

Filed June 11, 1948 2 Sheets-Sheet 2

INVENTOR.
JOHN E. WILLIAMS
BY A. H. Helvestine
ATTORNEY

Patented Mar. 20, 1951 2,545,507

UNITED STATES PATENT OFFICE 2,545,507

DOUBLE-BRIDGE PUSH-PULL DIFFERENTIAL AMPLIFIER

John E. Williams, Atlantic City, N. J.

Application June 11, 1948, Serial No. 32,517

7 Claims. (Cl. 179—171)

(Granted under the act of March 3, 1883, as amended April 30, 1928; 370 O. G. 757)

This invention relates to a broad band "double-bridge push-pull-differential" electronic amplifier.

The present invention also relates, in part, to my prior application, Serial No. 653,694 filed March 11, 1946, which disclosed means for conversion of single-sided excitation to push-pull amplification in a cascaded differential electronic amplifier.

The present invention further relates, in part, to my prior application, Serial No. 27,098 filed May 14, 1948, which disclosed means for effecting amplification of variable voltage or current in a push-pull-differential electronic amplifier, including means for effecting stable matching of consecutive stages in a cascaded push-pull-differential electronic amplifier.

One object of my invention is to provide improved means, in a basic stage of "double-bridge push-pull-differential" electronic amplification, capable of effecting stable, linear, high-gain amplification of variable voltages or currents, over a broad band of frequencies including zero cycles per second, at low noise level, inherently adapted to single-sided or to full-wave excitation, and with substantial freedom from jitter and drift normally resulting from voltage fluctuation in the power supply, from "strays," and from the adverse characteristics of vacuum tubes.

Another object of my invention is to provide means in, and in combination with, a basic stage of double-bridge push-pull-differential electronic amplification, capable of effecting substantial cancellation of that component of jitter and drift resulting by induction from changes in heater-cathode electric potential difference as heater current, heater voltage, or heater resistance of component vacuum tubes change.

A further object of my invention is to provide improved means in a cascaded, double-bridge push-pull-differential electronic amplifier, capable of effecting stable. linear, high-gain amplification of variable voltages or currents, over a broad band of frequencies including zero cycles per second. at low noise level, inherently adapted to half-wave or to full-wave excitation, and with substantial freedom from jitter and drift normally resulting from voltage fluctuation in the power supply, from the effects of "strays," and from the adverse characteristics of vacuum tubes.

Other and further objects of my invention will be understood from the specification hereinafter following by reference to the accompanying drawings in which:

Figure 1 shows a symmetrical electronic amplifier stage of the push-pull-differential type, balanced against the adverse effects of "strays," balanced against the adverse effects of voltage fluctuation in the power supply, capable of excitation by full-wave signals, particularly capable of effecting stable conversion of half-wave excitation to full-wave relations, and further capable of incorporation in a cascaded push-pull-differential electronic amplifier.

Figure 2 shows the embodiment of Figure 1, extended to include differential followers in a typical stage of double-bridge push-pull-differential amplification. The term "bridge element" is applied to that portion of the array which effects conversion to push-pull relations, since it may also be employed to provide increased voltage gain per stage as well as a stable voltage reference in a cascade of similar stages.

Figure 5A:
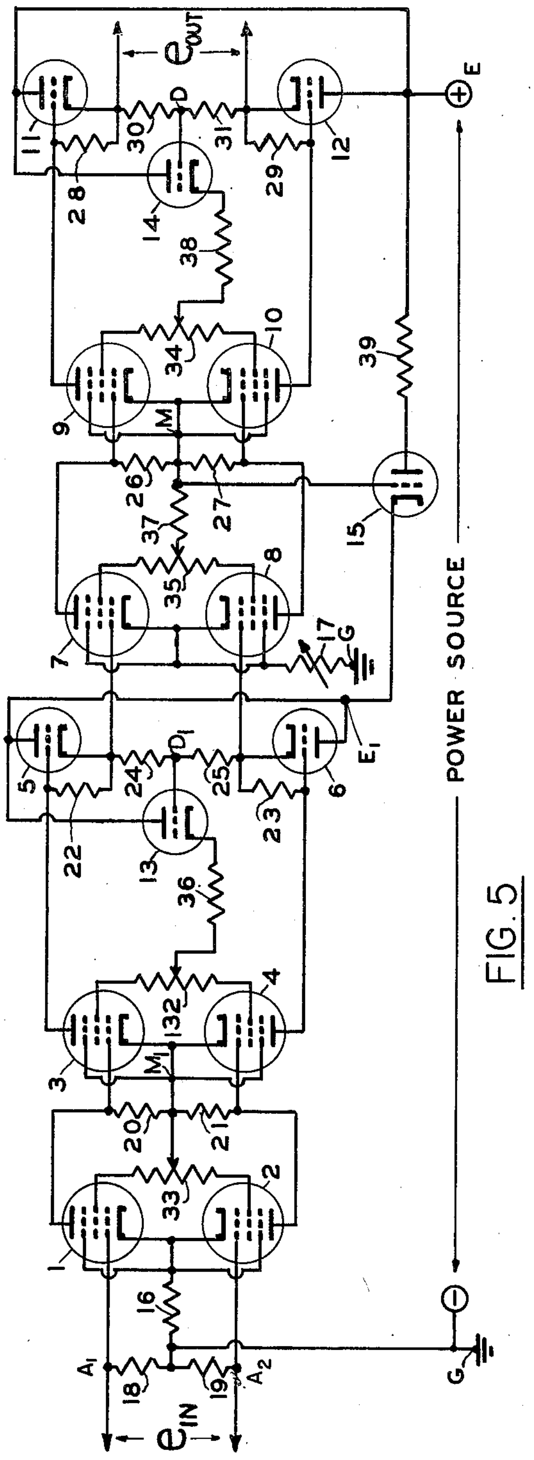
Figure 5A:
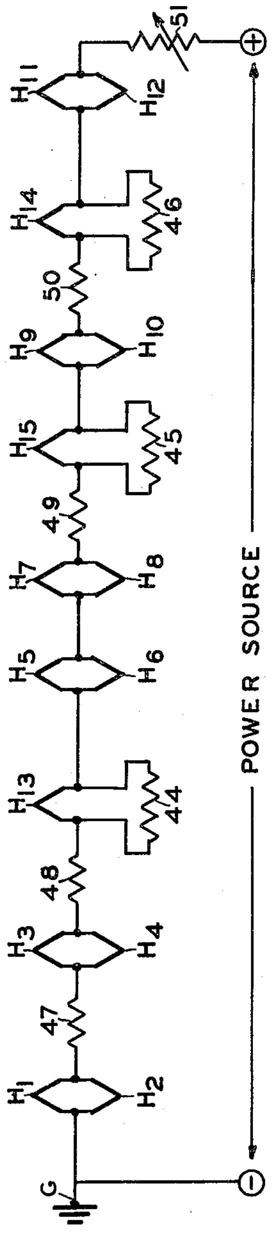

Figure 5 shows one of many possible embodiments of the double-bridge push-pull-differential amplifier in a cascade of stages, including means for cancellation of that component of drift and jitter normally caused by changes in heater-cathode potential difference of component tubes, also including means for effecting zero current in the differential load impedances "at balance," and further including means for effecting a stable "match" of the output of a preceding stage to the input of a succeeding stage by which actuated.

Fig. 5a shows a circuit diagram of the filament connections.

My invention is best described by explanation of typical electronic circuits set forth below. In these descriptions I do not limit my invention to the specific circuits, electronic tubes, or applications shown. I do, rather, consider my invention as a broad application of the general principles and circuits described, and as capable of operation with various combinations of presently available circuit elements and tubes.

To facilitate continuity in the following detailed discussion of the accompanying drawings, like circuit reference characters apply equally to all figures in identification of like circuit elements or functions.

Figure 1:
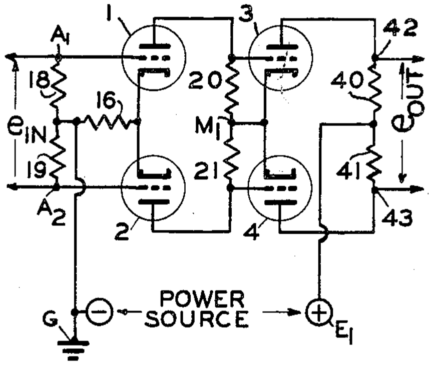

An elementary and usable embodiment of improved stable conversion to push-pull in a push-pull-differential type amplifier is shown in Figure 1, where reference characters 1 and 2 indicate "input" electronic tubes together with conventional means for providing electron emission, reference characters 3 and 4 indicate "bridge element" electronic tubes together with conventional means for providing electron emission, circuit element 16 indicates a self-biasing resistor mutual to the cathode circuits of input tubes 1 and 2 and interposed between them and ground, circuit elements 18 and 19 indicate suitable means for impressing a desired input signal, circuit elements 20 and 21 indicate suitable means for biasing "bridge element" tubes 3 and 4 and for impressing the output of input tubes 1 and 2 on the grids of bridge element tubes 3 and 4, circuit elements 40 and 41 represent suitable means for utilizing the amplified output of the bridge element tubes, in full-wave relation, circuit point G represents ground potential, circuit points $A_1$, $A_2$, and G represent suitable input terminals for impressing full-wave or half-wave signals as desired, circuit point $M_1$ indicates the mid-point of the bridge element input, circuit character $E_1$ represents the electric potential difference above ground of the first stage plate voltage supply at circuit point $E_1$, circuit characters 42 and 43 indicate suitable differentially related output terminals, and where suitable plate voltage power supply is indicated.

Figure 2:
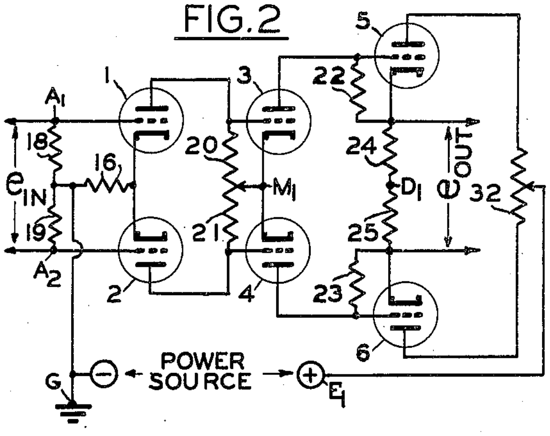

A basic embodiment of "double-bridge push-pull-differential" electronic amplification is shown in Figure 2, where reference characters 1, 2, 3, 4, 16, 18, 19, 20, 21, G, $A_1$, $A_2$, $M_1$, and $E_1$, indicate the same functions as described for Figure 1, reference characters 5 and 6 indicate electronic tubes of the differential follower element, reference characters 22 and 23 indicate suitable means for biasing the grids of differential follower tubes 5 and 6 and for impressing the output of bridge element tubes 3 and 4 on the grids of differential follower tubes 5 and 6, circuit elements 24 and 25 constitute the differential load impedance of the array and indicate suitable means for utilizing the amplified output, circuit point $D_1$ indicates the mid-point of the differential load impedance, circuit element 32 indicates a suitable means for effecting balance of the array, and where suitable plate voltage power supply is indicated.

Figure 3:
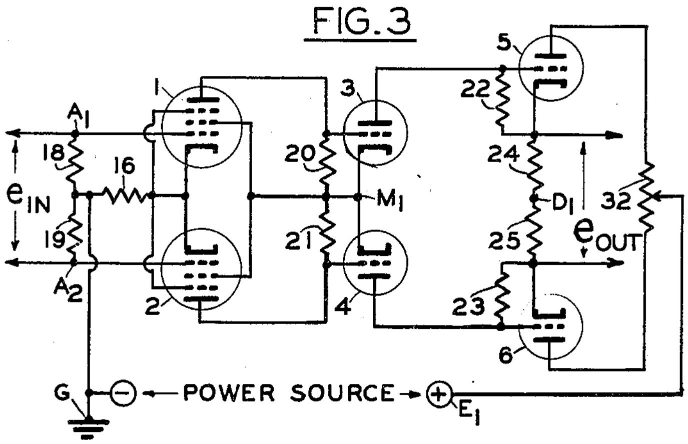
Figure 3 shows a further extension of the double-bridge push-pull-differential amplifier, incorporating pentodes as input tubes. Analysis indicates that the linearity of triodes in the bridge element is improved by diversion of a portion of their plate current to supply the screen-grids of the input tubes.

Another basic embodiment of double-bridge push-pull-differential electronic amplification, combining pentodes in the input element with triodes in the bridge and differential follower elements, is shown in Figure 3, where all reference characters indicate the same elements and functions previously described for Figure 2.

Figure 4:
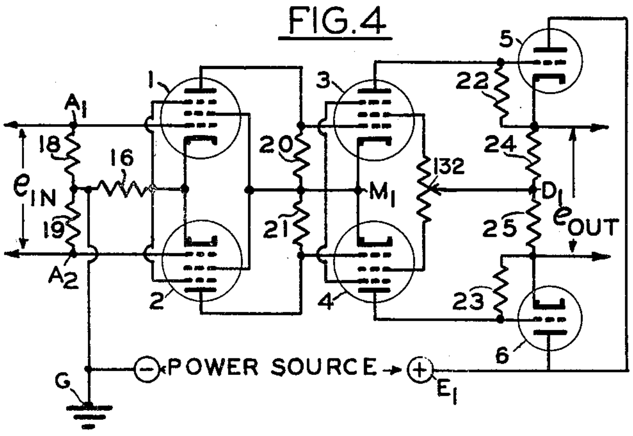
Figure 4 shows a still further extension of the double-bridge push-pull-differential amplifier incorporating pentodes both in the input element and in the bridge element, in combination with triodes in the differential follower element.

A further basic embodiment of double-bridge push-pull-differential amplification, combining pentodes in the input and bridge elements with triodes in the differential follower element is shown in Figure 4, where reference characters 1, 2, 3, 4, 5, 6, 16, 18, 19, 20, 21, 22, 23, 24, 25, $A_1$, $A_2$, G, $M_1$, $D_1$, and $E_1$, indicate the same elements and functions previously described for Figures 2 and 3, circuit element 132 continues to indicate a suitable means for effecting balance of the array but now appears in a new circuit position, and where suitable plate voltage power supply is indicated.

A typical cascade of double-bridge push-pull-differential electronic amplification is shown in Figure 5, where reference characters 1, 2, 3, 4, 5, 6, 16, 18, 19, 20, 21, 22, 23, 24, 25, 32, $A_1$, $A_2$, G, $M_1$, $D_1$, $E_1$, indicate the same circuit elements and functions previously described for Figure 4, circuit elements 24 and 25 additionally represent suitable means for impressing the output of the first stage on the input of the second stage, circuit elements 7 and 8 indicate input electronic tubes of the second stage together with conventional means for providing electron emission, circuit elements 9 and 10 indicate electronic tubes of the second stage bridge element together with conventional means for providing electron emission, circuit elements 11 and 12 indicate electronic tubes of the second stage differential follower element together with conventional means for providing electron emission, circuit elements 13 and 14 respectively represent "matching" electronic tubes of the first and second stages controlling the screen-grid voltage of the bridge element tubes in the respective stages and including conventional means for providing electron emission, circuit element 15 indicates a matching element electronic tube (or if required by circuit design more than one connected in parallel) effecting a "class A" match of the output of the first stage to the input of the second stage and including conventional means for providing electron emission, circuit element 33 indicates a suitable means for effecting balance of the first stage input tubes, circuit element 36 indicates a suitable means for effecting design adjustment of the screen-grid voltage of the first stage bridge element tubes with relation to the voltage at circuit point $D_1$, circuit element 17 indicates suitable means for effecting design adjustment of the cathode potential of the second stage input tubes, circuit elements 34 and 35 respectively indicate suitable means for effecting balance of the second stage bridge element tubes and input element tubes and of the second stage array, circuit elements 26 and 27 represent suitable means for effecting grid-bias of the second stage bridge element tubes and for impressing the output of the second stage input tubes 7 and 8 on the bridge element tube grids 9 and 10, circuit elements 28 and 29 indicate suitable means for biasing the grids of the second stage differential follower tubes 11 and 12 and for impressing the output of the second stage bridge element tubes 9 and 10 on the grids of the second stage differential follower tubes 11 and 12, circuit elements 30 and 31 represent the second stage differential load impedance and indicate suitable means for utilizing the output of the cascaded amplifier, circuit element 37 indicates suitable means for effecting design adjustment of the screen-grid voltage of the second stage input tubes 7 and 8 and of the plate voltage of the first stage plate voltage power supply, $E_1$, both voltages with respect to the potential at circuit point, M, the mid-point of the input to the second stage bridge element, circuit element 38 indicates suitable means for effecting design adjustment of the screen-grid voltage of the second stage bridge element tubes 9 and 10 in relation to the potential at circuit point D, the mid-point of the second stage differential load impedance, circuit element 39 indicates a suitable means for effecting design adjustment of plate voltage of the matching element tube 15, circuit elements $H_1$, $H_2$, $H_3$, $H_4$, $H_5$, $H_6$, $H_7$, $H_8$, $H_9$, $H_{10}$, $H_{11}$, $H_{12}$, $H_{13}$, $H_{14}$, $H_{15}$, indicate the heating elements of the electronic tubes corresponding to their subscripts, circuit elements 44, 45, 46 respectively indicate suitable means for adjustment of heater current in tubes 13, 15, and 14, circuit elements 47, 48, 49, 50 indicate suitable means for minimizing the heater-cathode potential difference of component tubes, circuit element 51 indicates suitable means for effecting adjustment of heater current in component tubes, reference character E represents the potential difference above ground of the cascaded array at circuit point E, and where suitable plate voltage power supply, and heater power supply are indicated.

With the foregoing in mind, I have observed, and it will be obvious to those versed in the art, that the following conditions exist, and the following sequence of events occurs, in the typical circuit of Fig. 1:

(*a*) First let it particularly be noted that all component tubes are normally self-biased in a symmetrical array, balanced, with respect to the potentials existing at the differential output terminals, 42 and 43, against "strays" and against reasonable voltage fluctuations in the plate voltage power supply.

(*b*) Next let it particularly be noted that the potential at $M_1$, the mid-point of the input to the bridge element, is established by circuit conditions integral within the array, and is not otherwise restrained.

(*c*) For convenience, but not restrictively, assume that tubes 1, 2, 3, 4 are exactly matched identical tubes, that circuit elements 20 and 21 are equal resistances, that circuit elements 40 and 41 are equal resistances, that circuit elements 18 and 19 are equal resistances, that circuit element 16 is a resistance equal in value to one half of circuit element 20, and that the values of circuit elements 40 and 41 are suitably chosen to effect linear amplification as related to the values of circuit elements 20 and 21 and as further related to the amplification constants of the component tubes. Let the heaters be connected in accordance with the schematics of Fig. 5*a*, and let the stage be placed in operation, unexcited. After a reasonable period of time tube temperature and ambient temperature will reach a heat balance whereby the effects of changes in tube geometry and contact potentials, created at the junctions of dissimilar metals within the tubes, will become stable and will be applied in equal magnitude to both sides of the symmetrical array. The circuit will then balance with the plate currents of all component tubes equal and with zero potential difference existing between the amplifier output terminals 42 and 43. Further, moderate changes in the heater power supply will result in changes in heater-cathode potential difference applied equally to both sides of the symmetrical array and will not disturb circuit balance. Still further, input tubes 1 and 2, act in parallel to control bridge element tubes 3 and 4, also acting in parallel, as a voltage regulator, establishing the potential at circuit point $M_1$. Also it is to be noted that reasonable changes in the voltage of the plate voltage power supply will be applied equally to both sides of the symmetrical array and will not disturb circuit balance as viewed at the differential output terminals 42 and 43.

(*d*) Now let a full-wave exciting signal be impressed across the input terminals $A_1$ and $A_2$ and, since this analysis is concerned with the input stage of a cascaded high-gain amplifier, let the signal be held within the conventional limits of tube linearity for small signals and let the signal be symmetrical with respect to ground potential. Now consider that instant at which the signal potential at $A_1$ is positive with respect to the signal potential at $A_2$. In comparison with circuit conditions existing for zero signal, the grids of input tubes 1 and 2 respectively are driven positive and negative by equal increments of voltage. The plate currents of input tubes 1 and 2 respectively increase and decrease by equal increments of plate current, which, flowing respectively through circuit elements 20 and 21, produce increments of voltage at the grids of bridge element tubes 3 and 4, equal in magnitude but opposite in phase. The grid of tube 3 is driven more negative and the grid of tube 4 is driven less negative. The values of circuit elements 40 and 41 have been so chosen, as related to the values of circuit elements 20 and 21 and the amplification constants of the component tubes, that the increments of plate current now occurring in bridge element tubes 3 and 4 not only will be equal in magnitude and opposite in phase but also respectively will equal the increments of plate current occurring in input tubes 2 and 1. Since the potentials at the output terminals 42 and 43, at any instant, are dependent respectively on the plate currents of bridge element tubes 3 and 4, an amplified, linear, differential output voltage is available for utilization as desired. This output voltage is in phase with the impressed signal and is symmetrical with respect to circuit point $E_1$. Additionally, since the plate current supplied to the array remains constant, the potential at the cathodes of input tubes 1 and 2 remains constant and the potential at the cathodes of bridge element tubes 3 and 4 remains constant.

(*e*) Now modify the restrictions placed on the impressed signal in (*d*) above to permit the mid-point potential of the impressed full-wave signal to vary, within reasonable limits, with respect to ground. Variation of this character might result from the characteristics of an electrical circuit under observation, or it might result from "stray" induction. In either case, variation in input signal voltage of this character would be impressed equally on both sides of the symmetrical array, would result in changes in the potential at the cathodes of input tubes 1 and 2 also at the cathodes of bridge element tubes 3 and 4, but it would not disturb the circuit balance as viewed at the differential output terminals 42 and 43, and it would not be contained as a component of the amplified output. Similarly, the electrical effects resulting from ageing of tubes, changes in heater current, or changes in plate voltage supply, within the capabilities of the component tubes, are applied equally to both sides of the symmetrical array and do not disturb circuit balance as viewed at the differential output terminals 42 and 43.

(*f*) It may now be observed that while an identity of component tubes is usually desirable, and remains desirable where the tubes are complementary with respect to circuit symmetry as, for example, input tubes 1 and 2 or bridge element tubes 3 and 4, identity of tubes in commercially available types is rare. Departure from identity among tubes of a given type may reasonably be ascribed to minor variation in the amplification constants of the tubes concerned resulting from variations in the geometry of these tubes. This lack of identity in tubes of the symmetrical array may properly be compensated by shifting the point $M_1$, by potentiometer methods, thus effecting circuit balance by varying the relative values of circuit elements 20 and 21. It should further be observed that by proper choice of circuit elements, input tubes 1 and 2 need not be of the same type as bridge element tubes 3 and 4.

(*g*) In analysis of the schematics of Figure 1 in effecting conversion of single-sided excitation to push-pull relations, let the stage be placed in operation and be balanced as described in (*c*) above. Now let a half-wave signal be impressed across input terminals $A_1$, and G, and consider that instant at which the potential at $A_1$ is positive with respect to ground. In comparison with circuit conditions existing for zero excitation, the grid of input tube 2 will remain at ground potential, and the grid of input tube 1 will be driven less negative. The plate current of tube 1 will increase and the plate voltage of tube 1 will decrease. The current through circuit element 16 will increase, the potential with respect to ground at the cathodes of tubes 1 and 2 will increase, the plate current of input tube 2 will decrease and the plate voltage of tube 2 will increase thereby effecting partial conversion to push-pull relations. The plate currents of input tubes 1 and 2 flowing respectively through circuit elements 20 and 21 will drive the grids of bridge element tubes 3 and 4 respectively more negative and less negative. The plate current of tube 3 will decrease, and the plate current of tube 4 will increase in response to two circuit conditions, firstly through the influence of decreased grid-bias voltage and secondly in response to the increased plate current demand of input tube 1. The increase in plate current of tube 4 in response to the increased plate current demand of input tube 1 results in an increased plate voltage drop in tube 4, lowering the plate voltage of tube 2 and further reducing the plate current of tube 2. The circuit now comes to balance with the increments of plate current of tubes 1 and 2 substantially equal but opposite in phase, with the potential at the cathodes of input tubes 1 and 2 tending to become more positive and with the potential at circuit point $M_1$ becoming less positive. The resulting increments of plate current in bridge element tubes 3 and 4 are substantially equal in magnitude, opposite in phase, and flowing through circuit elements 40 and 41 produce an amplified full-wave differential output voltage at output terminals 42 and 43, symmetrical with respect to circuit point $E_1$, in phase with the impressed signal voltage, and available for utilization as desired. Based on similar reasoning it is now obvious that two related or unrelated signals, impressed respectively across input terminals $A_1$ and G and $A_2$ and G, will be converted to full-wave relations, integrated, and amplified by the circuit of Figure 1. It should also be observed that, by proper choice of circuit elements, input tubes 1 and 2 may differ in type from bridge element tubes 3 and 4. It should further be observed that lack of identity in complementary tubes may be balanced as described in (*f*) above, without adversely affecting circuit performance.

With the foregoing in mind, I have observed, and it will be obvious to those versed in the art, that the following conditions exist, and the following sequence of events occurs, in the typical circuit of Fig. 2:

(*a*) The circuit characteristics previously described for Fig. 1 apply equally to the input and bridge elements of Fig. 2.

(*b*) The differential follower element of Fig. 2 is now substituted for circuit elements 40 and 41 of Fig. 1. This substition results in the "double-bridge push-pull-differential" amplifier, combining the improved stable conversion from single-sided excitation to full-wave relations, developed in the case of Fig. 1, with the advantageous characteristics and flexibility of the push-pull-differential amplifier disclosed in my prior application, referenced above. In this substitution, the plate currents of bridge element tubes 3 and 4, flowing respectively through circuit elements 22 and 23, again respectively, control the grid-cathode voltages of differential follower tubes 5 and 6, thus effecting control of the plate voltages and plate currents of tubes 5 and 6. In response to signal excitation, differential current then flows through the differential load impedance creating an amplified full-wave voltage, symmetrical with respect to circuit point $D_1$, in phase with impressed signal, and available for utilization as desired.

(*c*) Circuit "balance" may advantageously be effected as indicated in circuit element 32, by potentiometer methods, or may alternately be effected by potentiometer variation of the relative values of circuit elements 20 and 21 as described in discussion (*f*) of Fig. 1, above.

(*d*) Successful circuit performance does not require that the same type of tube be employed in the bridge and differential follower elements, but does require that the values of circuit elements 22 and 23 be so chosen in relation to the values of circuit elements 24, 25, and 32, that the increments of plate current in differential follower tubes 5 and 6 will respectively be equal to the increments of plate current in bridge element tubes 4 and 3 when the amplifier is excited by signal.

With the foregoing in mind, I have observed, and it will be obvious to those versed in the art, that the following conditions exist, and the following sequence of events occurs, in the typical circuit of Fig. 3:

(*a*) The circuit characteristics previously described above for the circuits of Fig. 1 and Fig. 2, except as noted below, apply equally to the circuit of Fig. 3.

(*b*) Input pentodes, as for instance type 6SJ7, may advantageously be combined with triodes in the bridge and differential follower elements, as for instance type 6SN7. When so combined, the screen-grid current of the input tubes is drawn directly from the circuit junction, $M_1$, of the bridge element tubes and does not flow through circuit elements 20 and 21. This shifts the dynamic load impedance of the bridge element tubes to an area on the characteristic curves of the bridge element tubes more favorable to linearity. Additionally, and under favorable conditions, the plate current of a pentode is substantially independent of plate voltage. This affords greater latitude in the choice of values of circuit elements 20 and 21 and results in increased voltage gain per stage. It also requires a new analysis of the circuit in effecting conversion from half-wave excitation to full-wave relations in the amplifier.

(*c*) It should now be noted that with zero signal excitation and the grid voltage of input pentodes 1 and 2 held constant, their mutual conductance is sensitive to the voltage applied to their screen-grids. Input tubes 1 and 2, acting in parallel, now function to control bridge element tubes 3 and 4, also acting in parallel, as voltage regulators tending to hold the potential at circuit point $M_1$ constant. This effect is also true and desirable in the case of full-wave excitation.

(*d*) Now let a half-wave exciting signal be impressed across the input terminals $A_1$ and G, and consider that instant at which the potential at $A_1$ is positive with respect to the potential at G. In comparison with circuit conditions existing for zero signal, the potential at the grid of input tube 2 remains at ground potential and the potential at the grid of input tube 1 is driven less negative. The plate current of tube 1 increases, the current through self-biasing resistor, circuit element 16, increases, the potential at the cathodes of input tubes 1 and 2 becomes more positive with respect to G, the plate current of input tube 2 decreases and the voltage effective at the screen-grids of tubes 1 and 2 decreases under two influences. This change in the effective value of screen-grid voltage of tubes 1 and 2, for the conditions described, is primarily caused by the increase in the average potential at the grids of input tubes 1 and 2 which, by increasing the total current through circuit elements 20 and 21, functions to decrease the potential at circuit point $M_1$, resulting in further decreasing the effective value of screen-grid voltage and in decreasing the screen-grid current which constitutes the second influence. The decrease in the effective value of screen-grid voltage, under the conditions described, reduces the mutual conductance of both input tubes 1 and 2, reducing their plate currents and establishing a circuit balance with the increments of plate current in tubes 1 and 2 equal in magnitude and opposite in phase. This constitutes conversion of single-sided excitation to full-wave relations.

With the foregoing in mind, I have observed, and it will be obvious to those versed in the art, that the following conditions exist, and the following sequence of events occurs, in the typical circuit of Fig. 4:

(a) Except as noted below, the circuit characteristics of Fig. 3, described above, apply equally to the circuit of Fig. 4.

(b) Pentodes, such as types 6SJ7, 12SJ7 or 9001, are now employed in the input and bridge elements in combination with triodes, such as types 6SN7, 12SN7, 1633, or 9002 in the differential follower element. This increases the voltage gain of the stage by concentrating the plate load impedance of the differential follower tubes in the differential load impedance. A further voltage gain is also available in circuit elements 20 and 21, as in the case of type 9001 tubes, where a normal grid bias of minus 3 volts is favorably combined with a plate current of 0.002 ampere.

(c) It should now be noted that balancing element 32 may now favorably be shifted from the plate circuit of the differential follower tubes preferably to the screen-grid circuit of the bridge element tubes, as shown at 132 or permissibly to the screen-grid circuit of the input tubes.

(d) It should now particularly be noted that input tubes 1 and 2 and bridge element tubes 3 and 4 now act as a cascaded amplifier in control of the differential follower tubes as voltage regulators. This functions to stabilize the voltage gain of the stage since any tendency to reduce the potential at circuit point $M_1$ with consequent reduction in the mutual conductance of input tubes 1 and 2, will be compensated by an appropriate increase in the mutual conductance of bridge element tubes 3 and 4.

With the foregoing in mind, I have observed, and it will be obvious to those versed in the art, that the following conditions exist, and the following sequence of events occurs, in the circuit of Fig. 5:

(a) Except as noted below, the circuit characteristics of Fig. 4, described above, apply equally to the circuits of Fig. 5.

(b) Two typical stages of "double-bridge push-pull-differential" amplification are now cascaded to demonstrate the flexibility of the basic circuit, and to establish a preferred, but not restrictive, means for effecting a stable cascade of a plurality of similar stages, or for effecting a combination of "double-bridge push-pull-differential" amplification with push-pull differential amplification in a stable cascade of stages, or the like.

(c) Two "matching element" tubes, 13 and 14, are now introduced to effect attainment of zero current "at balance" respectively in the differential load impedances of the first and second stages. Voltage dropping resistors, 36 and 38, are also introduced to permit design adjustment of the plate voltage of the bridge element tubes respectively of the first and second stages with respect to the potentials at the mid-points of the differential load impedances of their respective stages.

(d) Balancing elements, 33 and 35, are also introduced in the screen-grid circuits of the first and second stage input elements to effect further refinement in circuit balance.

(e) Circuit element 17 is introduced in the cathode circuit of the input tubes of the second stage to effect design adjustment of the potential at the cathodes of the second stage input tubes. Here it should particularly be noted that gaseous voltage regulator tubes may permissibly be substituted, in whole, or in part, for the resistance, here indicated, of circuit element 17, dependent on the rigor with which it may be desired to hold constant the potential at circuit point D, as, for instance, in exciting the deflecting elements of a cathode ray tube, or the like.

(f) It should particularly be noted that "matching element" tube 15 is incorporated in the array, excited by the potential at the mid-point, M, of the second stage bridge element input, to effect and maintain a "class A" match between the output of the first amplifier stage and the input of the second stage, effective both with respect to a stable cascading of differential amplification and with respect to a cascading of voltage regulation integral within the amplifier array. It should also be noted that circuit element 39 is included to permit design adjustment of the plate voltage of matching element tube 15, which may be a resistor or other suitable voltage dropping means, which, for certain choices of tubes is omitted entirely. Circuit element 37 is included to permit design adjustment of plate voltage supplied to the first stage. The action of this matching element tube is discussed in detail in my prior application, push-pull-differential amplifier, referenced above.

(g) It is noted that suitable values of shunt capacitance may be associated with the several balancing elements, and when so associated will serve to compensate the distributed capacitance of the array, thereby extending the frequency response of the amplifier.

(*h*) It is particularly noted that suitable tuned circuits, filters, or the like, may be employed, particularly in the input and differential load impedance elements, to extend the usefulness of the amplifier into the radio frequency spectrum.

(*i*) It is recognized that the heater connections indicated constitute one of several methods which may be employed firstly to minimize heater-cathode potential difference and particularly to ensure that changes in heater-cathode potential difference shall be applied equally to both sides of a symmetrical array in such manner as to effect cancellation of the voltages thereby induced in the array. The principle involved is held to be inherent and sufficiently described by the schematics of Fig. 5 and the foregoing comment.

Summarizing to ensure clarity, it is particularly noted that a basic stage of double-bridge push-pull-differential amplification is an electrically symmetrical array inherently comprising three functional elements, namely, an "input element," a "bridge element," and a "differential follower element" together with the electrical circuits providing means for the control of the electronic tubes comprising said elements and for utilizing the output of said tubes, wherein the output circuits of the input element tubes contain circuit components common with the input circuits of the bridge element tubes, and wherein the output circuits of the bridge element tubes contain circuit elements common with the input circuits of the differential follower element tubes, and further contain circuit elements common with the output circuits of said differtenial follower tubes, and further wherein, by proper choice of circuit components, triodes or pentodes may be employed in the input element, and in the bridge element, in combination with the preferable employment of triodes in the differential follower element, and still further wherein the electrical potentials existing at the electrical junction of the cathodes of the bridge element tubes, and at the electrical mid-point of the differential load impedance, are established by circuit conditions and are not otherwise restrained.

Further summarizing to ensure clarity, the input element is defined as that portion of the symmetrical array of a typical stage of double-bridge push-pull-differential amplification comprising the input element tubes together with the electrical circuits and circuit components providing means for the control of said tubes and for utilizing the output of said tubes. More particularly, and with convenient reference to the first stage of Fig. 5, the input element includes input tubes 1 and 2 and the electrical circuits containing circuit components 16, 18, 19 and circuit point G, the electrical circuits containing circuit elements 20, 21, and, when pentodes are employed, further including the electrical circuit containing circuit component 33, and wherein circuit components 20 and 21 are common with the output circuits of input element tubes 1 and 2 and with the input circuits of bridge element tubes 3 and 4. The function of the input element is utilization of a full-wave or half-wave signal voltage, or a signal current, for amplification of said signal voltage, or signal current, and delivery of said amplified signal voltage or signal current to the input of the bridge element.

The bridge element is defined as that portion of the symmetrical array of a double-bridge push-pull-differential amplifier comprising the bridge element tubes together with the electrical circuits and circuit components providing means for the control of the bridge element tubes and for utilizing the output of said tubes, or more particularly, and with continued convenient reference to the first stage of Fig. 5, bridge element tubes 3 and 4, and the electrical circuits containing circuit components 20, 21 and circuit point $M_1$, the electrical circuits containing circuit elements 22, 23, 24, 25, and, when pentodes are employed in the bridge element, the electrical circuits containing circuit components 132 and 36, and wherein circuit components 22 and 23 are common with the input of differential follower tubes 5 and 6, and further wherein circuit components 24 and 25 are common with the output circuits of differential follower element tubes 5 and 6. The function of the bridge element is utilization of the signal delivered by the input element, and in combination with the input element, to effect conversion of said signal to full-wave relations, control of the differential follower element tubes to effect voltage regulation integral within the amplifier stage, control of the differential follower tubes to effect a cascade of push-pull-differential amplification, and provision of a suitable reference voltage at the electrical junction of the cathodes of the bridge element tubes at circuit point M, of each stage except the first stage, for the excitation of a matching element hereinafter defined.

The differential follower element is defined as that portion of the symmetrical array of a double-bridge push-pull-differential amplifier comprising the differential follower tubes together with the electrical circuits and circuit components providing means for the control of said tubes, for utilizing the output of said tubes, and, where triodes are employed in the bridge element, for balancing the stage, or more particularly with continued convenient reference to the first stage of Fig. 5, differential follower tubes 5 and 6, and the electrical circuits containing circuit elements 22, 23, 24, 25 and circuit points $D_1$ and $E_1$ and now with convenient reference to Fig. 2 the electrical circuits containing circuit component 32, and wherein circuit components 22, 23, 24, and 25 are common with the output circuits of the bridge element tubes of both Fig. 5, and Fig. 2. The function of the differential follower element is utilization of the amplified signal delivered by the bridge element, and in push-pull-differential combination with the output of the bridge element to provide a push-pull-differential output voltage, or current, for utilization as desired, and action as a voltage regulator to provide suitable voltage regulation integral within the amplifier stage.

Now summarizing to ensure clarity, and with convenient reference to Fig. 5, it is most particularly noted that a stable cascade of double-bridge push-pull-differential amplification requires a cascade of voltage regulation integral within a cascade of stages. This cascade of voltage regulation is provided by inclusion of a matching element particular to each stage except the first. The matching element is defined as that portion of the array comprising an electronic tube, more particularly matching element tube 15 with the grid of said tube connected to the electrical junction M of the cathodes of bridge element tubes 9 and 10, with the plate of said matching element tube 15 suitably connected to the positive terminal of the plate voltage supply of the stage with which associated, more particularly connected to circuit point E, and with its cathode connected to the plates of the differential follower tubes of the preceding stage and forming the positive terminal of the plate voltage supply of said preceding stage, more particularly circuit point $E_1$, and wherein, as the potential at circuit point M varies with changes in circuit conditions, the potential at circuit point M, being common with the grid voltage of matching element tube 15, acts to control the plate current of matching element tube 15. The plate current of matching element tube 15, being identical with the cathode current of said tube now becomes the total plate voltage supply current of the preceding stage, this current passing through circuit point $E_1$.

The term circuit conditions is used for convenience to refer to the various values of grid voltage, plate current, and, where applicable, as when pentodes are employed in preference to triodes, screen-grid voltage and current of the component tubes of the array regardless of the instant value of plate supply voltage, and under the various conditions of excitation.

It is now noted, with convenient reference to Fig. 5, that as the plate voltage of the first stage differential follower tubes 5 and 6, tends to become more positive, the potentials at the cathodes of said differential follower tubes tend to become more positive and, being mutual to the grids of second stage input tubes 7 and 8, cause the plate current of said input tubes 7 and 8 to increase. As the plate currents of input tubes 7 and 8 tend to increase, the grid-biases of bridge element tubes 9 and 10 tend to become more negative thus causing the potential at circuit point M to become less positive, hence providing a suitably phased reference voltage at the grid of matching element tube 15, thereby tending to lower the potential at circuit point $E_1$ and restoring a class A match between the differential output of the first stage and the input to the succeeding stage. This class A match assures linearity of amplification and prevents "motor-boating" of cascaded stages under conditions of high amplification regardless of small changes in power supply voltage. This constitutes voltage regulation integral within the cascaded amplifier, vital to the successful operation of the direct current amplifier at high gain ratios.

The invention described herein may be manufactured and used by or for the Government of the United States of America for governmental purposes without payment of any royalties thereon or therefor.

I claim as my invention:

1. In a multistage push-pull-differential amplifier having a first stage arranged in differential bridge form; first and second input pentodes having control grids connected to opposite ends of a centrally grounded input signal impedance, said pentodes having the cathodes thereof grounded through a common bias resistor, having anodes thereof connected to opposite ends of a differential load impedance, and having screen grids connected to opposite ends of a potential divider, said potential divider having a variable third arm connected at a midpoint of said load impedance; second and third pentodes having grids thereof connected to said opposite ends of the differential load impedance for differential amplification of the signal voltage therein, having cathodes thereof connected to said midpoint, having anodes adapted for connection to differential stage output tubes, and having screen grids connected to opposite ends of a potential divider; a pair of differential follower tubes having anodes thereof connected to a common voltage supply, last said tubes having control grids connected respectively to the anodes of said third and fourth pentodes, having cathodes connected to opposite ends of a stage differential output impedance, and having grid bias resistors respectively connected to the grids and cathodes of last said tubes, whereby said grid bias resistors are connected in series with said output impedance to complete circuit between the anodes of the third and fourth pentodes; a voltage regulator control tube having an anode connected to said common voltage supply and a control grid connected to the electrical center of the stage output impedance, and having a cathode resistively coupled adjustably to the approximate electrical center of said potential divider connected to the screen grids of the third and fourth pentodes, whereby said regulator control tube and said differential follower tubes supply regulated voltage to last said screen grids and control a cascaded reference potential at first said screen grids; a second stage identical with said first stage and having said control grids of the first and second pentodes connected to the cathodes of said differential follower tubes of the first stage, the output impedance thereof being the input impedance of said second stage; vacuum tube means controlled by said reference potential of the second stage supplying voltage from said common supply of the second stage to said common supply of the first stage, said means effectively matching the voltage supply of said stages for simultaneous class A amplification of signal in both stages.

2. The amplifier of claim 1 wherein said potential dividers are adjusted to match the current in the respective arms of said bridges for the condition of no signal in the input impedance.

3. A push-pull differential electronic amplifier stage comprising a plurality of vacuum tubes arranged in functional elements, an input circuit connected to at least one of said tubes, a second tube connected in push-pull relation with said first tube to form an input element, a circuit containing a resistance element common to the cathode circuits of said first and second tubes and terminating at the negative terminal of the plate voltage power supply, a third tube and a fourth tube having control grids thereof connected to the plates, respectively, of the first and second tubes, a circuit containing an element common to the output of said first tube and the input of said third tube, a circuit containing an element common to the output of said second tube and the input of said fourth tube, a common electrical junction mutual to the cathodes of said third and fourth tubes and to said input circuits of said third and fourth tubes, a circuit connecting the screen-grids of said first and second tubes to said common circuit junction, a fifth tube and a sixth tube connected to the plates of the third and fourth tubes, respectively, and forming a differential follower element, a circuit containing an impedance element common to the output of said third tube and the input of said fifth tube, a circuit containing an impedance element common to the output of said fourth tube and the input of said sixth tube, a differential load element common to the output circuits of said third, fourth, fifth and sixth tubes, said load element being connected at the ends thereof to the cathodes, respectively, of the fifth and sixth tubes and having stage output terminals at said ends, respectively, a matching element controlling the amplifier stage voltage for class A amplification, said element including a seventh tube having its grid connected to the electrical mid-point of said differential load element and a balancing potentiometer element connected to the screen-grids of said third and fourth tubes and having a moveable contact connected to the cathode of said seventh tube, and means connecting the plates of said fifth, sixth, and seventh tubes to the positive terminal of the plate voltage power supply.

4. In a push-pull differential amplifier system of the character disclosed, a plurality of stages of amplification comprising in each stage; an input element including a pair of input tubes connected in push-pull arrangement, an impedance bridge element including a voltage controlling tube in each of two arms thereof, said tubes having cathodes thereof connected at one end of the major diagonal of said bridge and having the impedances thereof controlled by the currents in said input tubes, respectively, said bridge having third and fourth arms each comprising a tube connected at the plate thereof to a source of positive voltage and at the cathode thereof at the ends of the cross diagonal of the bridge; an input differential impedance element connected along said cross diagonal, whereby the third and fourth said arms and said differential impedance comprise a differential signal follower circuit; and a matching element including a voltage controlling tube connected between said sources of positive voltage supply of successive stages, the matching element effectively controlling a prior said stage plate voltage for class A amplification, the conductivity of said voltage controlling tube being controlled by a grid thereof connected to one end of the major bridge diagonal of a following said stage.

5. A push-pull differential electronic amplifier system comprising a plurality of stages of amplification in which each stage comprises; a symmetrical push-pull input element including a pair of similar tubes, an amplifying differential bridge element including in the first and second arms thereof, respectively, a pair of similar pentode tubes responsive, respectively, to the current flow in the tubes of the input element, and in the third and fourth arms thereof a differential follower element including a pair of tubes connected responsively to the first and second tubes, respectively, of the bridge element, the follower tubes having plates thereof connected to a positive voltage supply and the grids thereof connected to the plates of the first and second tubes of the bridge, respectively, the bridge having a differential load element common to the output circuits of said differential follower tubes and to the output of said first and second bridge element tubes, the cathodes of said follower tubes being connected at taps within said differential load element for biasing the follower tube grids for conduction in inverse proportion to the currents in said first and second arms of the bridge, said follower tubes being parallel-connected to supply regulated voltage to the screen grids of said pentode tubes, thereby to stabilize gain in the stage.

6. The amplifier of claim 5 with an additional tube in each stage thereof having its grid at the potential of the electrical mid-point of said differential load element, its plate at the potential of the plates of the tubes of said differential follower element, and having the cathode thereof connected to the screen-grids of the tubes of said bridge element, whereby said tube functions to control the screen-grid voltage and screen grid current of the tubes of said bridge element.

7. The amplifier of claim 5 with an additional tube in each stage, except the first, and having the grid thereof at the common potential of the cathodes of the first pair of tubes of the bridge element, the plate of said additional tube being connected through voltage dropping means to the positive terminal of plate voltage supply of said stage, and the cathode of said additional tube constituting the positive terminal of the plate voltage supply of the next preceding stage, whereby linear amplification in successive stages is maintained by a matching of the input of each such stage with the output of the preceding stage.

JOHN E. WILLIAMS.

REFERENCES CITED

The following references are of record in the file of this patent:

UNITED STATES PATENTS

| Number | Name | Date |
|---|---|---|
| 1,822,922 | Culver | Sept. 15, 1931 |
| 2,232,212 | Cary | Feb. 18, 1941 |
| 2,288,600 | Arndt | July 7, 1942 |
| 2,310,342 | Artzt | Feb. 9, 1943 |
| 2,329,073 | Mitchell | Sept. 7, 1943 |
| 2,424,893 | Mansford | July 29, 1947 |